(12) United States Patent
Hsu

(10) Patent No.: US 7,544,599 B2
(45) Date of Patent: Jun. 9, 2009

(54) MANUFACTURING METHOD OF SOLDER BALL DISPOSING SURFACE STRUCTURE OF PACKAGE SUBSTRATE

(75) Inventor: Shih-Ping Hsu, Hsin-Chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 114 days.

(21) Appl. No.: 11/873,616

(22) Filed: Oct. 17, 2007

(65) Prior Publication Data
US 2009/0081861 A1 Mar. 26, 2009

(51) Int. Cl.
*H01L 21/00* (2006.01)
(52) U.S. Cl. .................. 438/613; 438/612; 438/615
(58) Field of Classification Search ................ 438/613, 438/612, 615
See application file for complete search history.

(56) References Cited

U.S. PATENT DOCUMENTS

| | | | |
|---|---|---|---|
| 6,515,370 B2 * | 2/2003 | Hashimoto | 257/777 |
| 7,217,999 B1 * | 5/2007 | Honda | 257/712 |
| 2002/0180040 A1 * | 12/2002 | Camenforte et al. | 257/738 |
| 2003/0001286 A1 * | 1/2003 | Kajiwara et al. | 257/778 |
| 2005/0157477 A1 * | 7/2005 | Kuramochi et al. | 361/761 |
| 2005/0221601 A1 * | 10/2005 | Kawano | 438/622 |
| 2006/0017160 A1 * | 1/2006 | Huang | 257/737 |
| 2007/0029654 A1 * | 2/2007 | Sunohara et al. | 257/678 |
| 2007/0184604 A1 * | 8/2007 | Honda | 438/206 |
| 2007/0287230 A1 * | 12/2007 | Kuramochi et al. | 438/128 |
| 2008/0083560 A1 * | 4/2008 | Saiki et al. | 174/255 |
| 2008/0149384 A1 * | 6/2008 | Kawabe | 174/265 |
| 2008/0265392 A1 * | 10/2008 | Kawano | 257/688 |
| 2009/0038838 A1 * | 2/2009 | Chang | 174/264 |
| 2009/0081861 A1 * | 3/2009 | Hsu | 438/613 |

* cited by examiner

*Primary Examiner*—Laura M Menz
(74) *Attorney, Agent, or Firm*—Foley & Lardner LLP

(57) ABSTRACT

A manufacturing method of a solder ball disposing surface structure on a core board including: providing a core board with a first metal layer and an opposing metal bump-equipped second metal layer; forming resists on the first and second metal layers respectively; forming third, fourth and fifth openings in the resists; removing the first and second metal layers in the third and fourth openings to form first and second circuit layers and metal pads respectively; removing the metal bumps in the fifth openings to form metal flanges; removing the resists; forming first and second insulative protection layers on the first and second circuit layers and metal pads respectively; forming first and second openings in the first and second insulative protection layers to expose the first circuit layer as electrical connecting pads and expose the metal flanges respectively. Accordingly, increased contact surface area for mounting conductive elements prevents detachment thereof.

20 Claims, 12 Drawing Sheets

US 7,544,599 B2

MANUFACTURING METHOD OF SOLDER BALL DISPOSING SURFACE STRUCTURE OF PACKAGE SUBSTRATE

CROSS REFERENCE TO RELATED APPLICATION

This application is related to the disclosure of Taiwanese Patent Application Number 096135299 filed on Sep. 21, 2007, the disclosure of which is expressly incorporated herein by reference in its entirety.

FIELD OF THE INVENTION

The present invention relates generally to manufacturing methods of solder ball disposing surface structures, and more particularly to a manufacturing method of solder ball disposing surface structures of a package substrate.

BACKGROUND

Along with the rapid development of the electronic industries, the present electronic products are developed towards multi-function and high performance. To meet requirements of semiconductor packages for high integration and miniaturization, package substrates for carrying semiconductor chips have been developed from single layer boards to multi-layer boards. Meanwhile, interlayer connection techniques have been used to increase available circuit layout area in a limited space, thereby meeting requirements of high-density integrated circuits.

The present package substrates for carrying semiconductor chips comprise wire bonding package substrates, chip scale package (CSP) substrates, flip chip ball grid array (FCBGA) package substrates and so on. FIG. 1 exemplifies a conventional flip-chip package substrate. As shown in FIG. 1, a package substrate 11 is provided, which comprises a first surface 11a for chip mounting and a second surface 11b for solder ball attachment. A plurality of first electrical connecting pads 111 to be electrically connected with a semiconductor chip 12 are formed on the first surface 11a, and a plurality of first conductive elements 13a made of solder material are formed on surface of the first electrical connecting pads 111. Further, a plurality of second electrical connecting pads 112 to be electrically connected with other electronic device such as a printed circuit board are formed on the second surface 11b, and a plurality of second conductive elements 13b made of solder material are formed on surface of the second electrical connecting pads 112. The semiconductor chip 12 has a plurality of electrode pads 121. Metal bumps 14 are formed on the surface of each of the electrode pads 121 in a flip-chip manner and corresponding in position to the first conductive elements 13a of the package substrate 11. Then at a reflow temperature capable of melting the first conductive elements 13a, the first conductive elements 13a are reflowed to the corresponding metal bumps 14, thereby electrically connecting the semiconductor chip 12 to the package substrate 11.

However, as the contact area between the second electrical connecting pads 112 on the second surface 11b of the package substrate 11 and the corresponding second conductive elements 13b is only limited to the exposed area of the second electrical connecting pads 112, the bonding force between the second conductive elements 13b and the second electrical connecting pads 112 can be poor due to insufficient contact area therebetween, and accordingly the second conductive elements 13b can easily detach from the second electrical connecting pads 112. For example, if the pitch between the second electrical connecting pads 112 is decreased from 800 μm to 400 μm, and the diameter of each of the openings for the second electrical connecting pads 112 is decreased from 500 μm to 250 μm, the contact area will be decreased to one-fourth of the initial contact area, which thus seriously reduces the bonding force between the conductive elements and the electrical connecting pads.

FIGS. 2A to 2E are diagrams showing a conventional method for increasing the contact area between the conductive elements and the electrical connecting pads on the solder ball disposing surface of a package substrate. As shown in FIG. 2A, the solder ball disposing surface of the package substrate 20 is formed with electrical connecting pads 201. An insulative protection layer 21 is formed on the solder ball disposing surface and the electrical connecting pads 201, and a plurality of openings 210 is formed in the insulative protection layer 21 for exposing a part of the surface of the electrical connecting pads 201. As shown in FIG. 2B, a conductive layer 22 is formed on the insulative protection layer 21 and the exposed surface of the electrical connecting pads 201. As shown in FIG. 2C, a resist layer 23 is formed on the conductive layer 22, and a plurality of ring-shaped openings 230 is formed in the resist layer 23 by exposure and development so as to expose the conductive layer 22 on the electrical connecting pads 201 around the openings 210 of the insulative protection layer 21. As shown in FIG. 2D, by using the conductive layer 22 as a current conductive path for electroplating, flanges 24 are formed in the ring-shaped openings 230, the flanges 24 being attached to periphery of the openings 210 of the insulative protection layer 21. Finally, the resist layer 23 and the conductive layer 22 covered by the resist layer 23 are removed so as to expose the flanges 24 and a part of the surface of the electrical connecting pads 201.

However, since the conductive layer 22 is left between the flanges 24 and the electrical connecting pads 201, the bonding strength between the flanges 24 and the electrical connecting pads 201 is reduced. In addition, as the formed flanges 24 are attached to the periphery of the openings 210 of the insulative protection layer 21, the present method provides only a limited increase of the contact area for the conductive elements such as solder balls subsequently formed on the electrical connecting pads 201 and the flanges 24. As a result, detaching of the solder balls still can easily occur. Therefore, how to provide a structure capable of increasing the bonding force between solder balls and electrical connecting pads on the solder ball disposing surface of a package substrate so as to avoid detaching of the solder balls from the electrical connecting pads caused by reduced bonding area has become urgent.

SUMMARY

According to the above drawbacks, an objective of the present invention is to provide a manufacturing method of a solder ball disposing surface structure of a package substrate through which contact area of the surface structure for mounting conductive elements can be increased.

Another objective of the present invention is to provide a manufacturing method of a solder ball disposing surface structure of a package substrate through which the bonding force between the solder ball disposing surface structure and the conductive elements can be increased.

In order to attain the above and other objectives, the present invention discloses a manufacturing method of a solder ball disposing surface structure of a package substrate, which comprises: providing a core board with a first metal layer and a second metal layer respectively formed on two opposite surfaces thereof; forming metal bumps on the second metal layer by electroplating; forming a third resist layer on the first metal layer and forming third openings in the third resist layer for exposing a part of the surface of the first metal layer, and forming a fourth resist layer on the second metal layer and the metal bumps and forming fourth openings in the fourth resist layer for exposing a part of the surface of the second metal layer and forming fifth openings in the fourth resist layer for exposing a part of the surface of the metal bumps; removing the first and second metal layers in the third and fourth openings of the third and fourth resist layers so as to respectively form a first circuit layer, a second circuit layer and metal pads on the two opposite surfaces of the core board, and removing the metal bumps in the fifth openings so as to form metal flanges disposed around the metal pads; removing the third and fourth resist layers; forming a first insulative protection layer on the core board and the first circuit layer and forming first openings in the first insulative protection layer for exposing a part of the surface of the first circuit layer as electrical connecting pads; and forming a second insulative protection layer on the core board, the second circuit layer and the metal pads, and forming second openings in the second insulative protection layer so as to expose a part of the surface of the metal flanges.

Therein, size of the second openings can be not bigger than outer diameter of the metal flanges. Alternatively, size of the second openings can be bigger than outer diameter of the metal pads.

The core board can be a two-layer or multi-layer circuit board with a dielectric layer on surface thereof or an insulating board. The metal flanges can have a shape of circle, ellipse, rectangle or irregular shape. The metal pads can have a shape of circle, ellipse, rectangle or irregular shape. Outer diameter of the metal flanges is not bigger than that of the metal pads.

The manufacturing method of forming the metal bumps on the second metal layer by electroplating comprises: forming a first resist layer and a second resist layer on the first metal layer and the second metal layer respectively, the second resist layer having openings for exposing a part of the surface of the second metal layer; forming metal bumps on the second metal layer in the second openings of the second resist layer by electroplating; and removing the first and second resist layers so as to expose the first metal layer, the second metal layer and the metal bumps.

In the above-described manufacturing method, the metal bumps in the fifth openings are partly removed so as to form a metal layer on the metal pads. A surface treatment layer is formed on the metal flanges and the metal layer. The surface treatment layer may be one of an OSP (Organic solderability preservatives) layer, a Ni/Au layer, a Ni/Pd/Au layer and a Sn/Pb layer. Alternatively, the surface treatment layer may be made of one of the group consisting of Au, Ag, Sn and Cu. Conductive elements of solder balls are further formed on the surface treatment layer or formed on the metal flanges and the metal layer.

According to another embodiment of the present invention, the metal bumps in the fifth openings are thoroughly removed so as to expose a part of the surface of the metal pads. A surface treatment layer is formed on the metal flanges and the metal pads. The surface treatment layer may be one of an OSP layer, a Ni/Au layer, a Ni/Pd/Au layer and a Sn/Pb layer. Alternatively, the surface treatment layer may be made of one of the group consisting of Au, Ag, Sn and Cu. Conductive elements of solder balls are further formed on the surface treatment layer or formed on the metal flanges and the metal pads.

The present invention provides another manufacturing method of a solder ball disposing surface structure of a package substrate, which comprises: providing a core board; forming a conductive layer on two opposite surfaces of the core board; respectively forming a first resist layer and a second resist layer on the conductive layer on the two opposite surfaces of the core board, the first and second resist layers respectively having first openings and second openings for exposing a part of the surface of the conductive layer; respectively forming a first circuit layer and a second circuit layer in the first and second openings of the first and second resist layers by electroplating, wherein the second circuit layer has metal pads; forming a third resist layer on the first resist layer and the first circuit layer, and forming a fourth resist layer on the second resist layer and the second circuit layer, the fourth resist layer having ring-shaped openings for exposing a part of the surface of the metal pads; forming metal flanges on the metal pads by using the conductive layer as a current conductive path for electroplating; removing the third resist layer, the first resist layer and the conductive layer covered by the first resist layer, the fourth resist layer, the second resist layer, and the conductive layer covered by the second resist layer, thereby exposing the first circuit layer, the second circuit layer and the metal flanges on the metal pads; forming a first insulative protection layer on the core board and the first circuit layer and forming first openings in the first insulative protection layer for exposing a part of the surface of the first circuit layer as electrical connecting pads; and forming a second insulative protection layer on the core board, the second circuit layer and the metal pads, and forming second openings in the second insulative protection layer so as to expose a part of the surface of the metal flanges.

Therein, size of the second openings can be not bigger than outer diameter of the metal flanges. Alternatively, size of the second openings can be bigger than outer diameter of the metal pads.

The core board can be a two-layer or multi-layer circuit board with a dielectric layer on surface thereof, a copper clad laminate board, or an insulating board. The metal flanges can have a shape of circle, ellipse, rectangle or irregular shape. The metal pads can have a shape of circle, ellipse, rectangle or irregular shape. Outer diameter of the metal flanges is not bigger than that of the metal pads.

A surface treatment layer can further be formed on the metal flanges and the metal pads. The surface treatment layer may be one of an OSP layer, a Ni/Au layer, a Ni/Pd/Au layer and a Sn/Pb layer. Alternatively, the surface treatment layer may be made of one of the group consisting of Au, Ag, Sn and Cu. Conductive elements of solder balls are further formed on the surface treatment layer or formed on the metal flanges and the metal pads.

According to the present invention, as metal flanges are formed on the metal pads of the solder ball disposing surface of a package substrate, contact area of the metal pads is increased. In addition, the bonding area for conductive elements on electrical connecting pads can further be increased by adjusting type of openings in the insulative protection layer. Moreover, since no conductive layer is formed between the metal pads and the metal flanges as in the prior art, the bonding strength between the metal pads and the metal flanges is improved, thereby preventing detaching of the conductive elements subsequently formed on the metal pads and the metal flanges.

BRIEF DESCRIPTION OF DRAWINGS

FIG. 4G' is another embodiment of FIG. 4G;

DETAILED DESCRIPTION

The following illustrative embodiments are provided to illustrate the disclosure of the present invention, these and other advantages and effects can be apparent to those skilled in the art after reading the disclosure of this specification.

First Embodiment

FIGS. 3A to 3H are sectional diagrams showing a manufacturing method of a solder ball disposing surface structure of a package substrate according to a first embodiment of the present invention.

Figure 1:
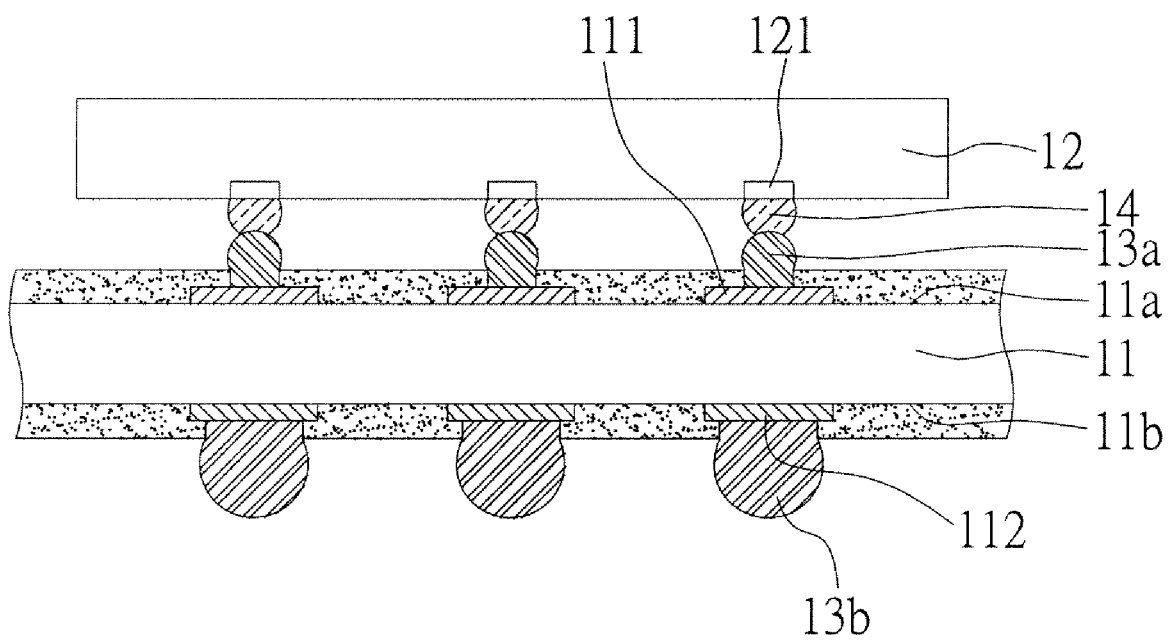
FIG. 1 is a diagram of a conventional package substrate with a semiconductor chip disposed thereon.
Figure 2A:
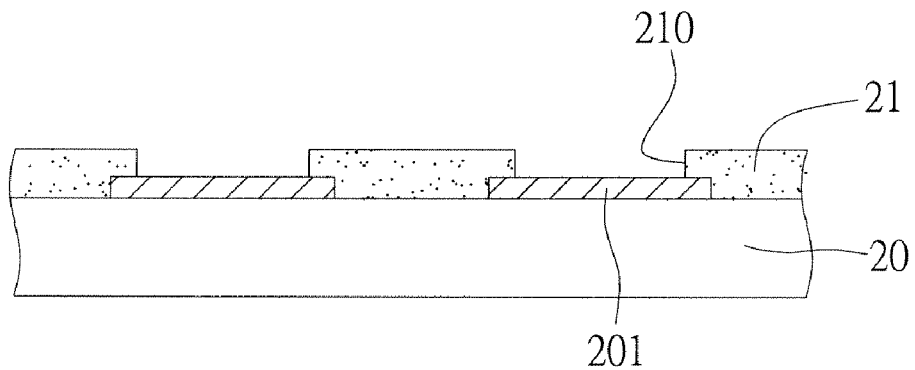
FIGS. 2A to 2E are sectional diagrams showing a conventional method for forming flanges on electrical connecting pads of a package substrate.
Figure 2B:
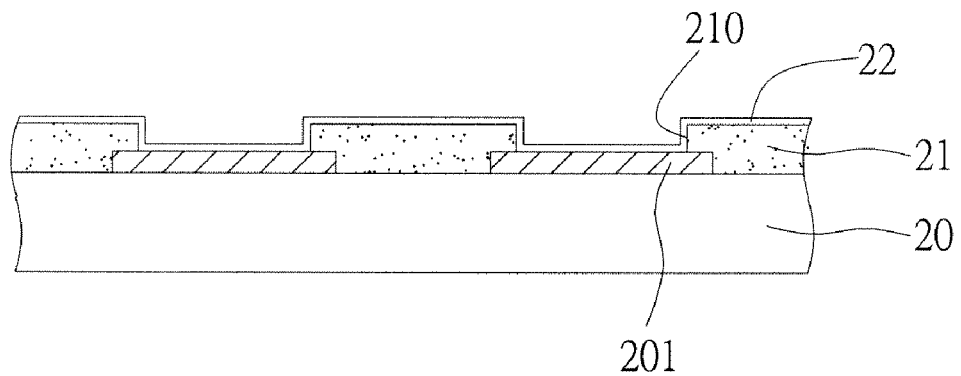
Figure 2C:
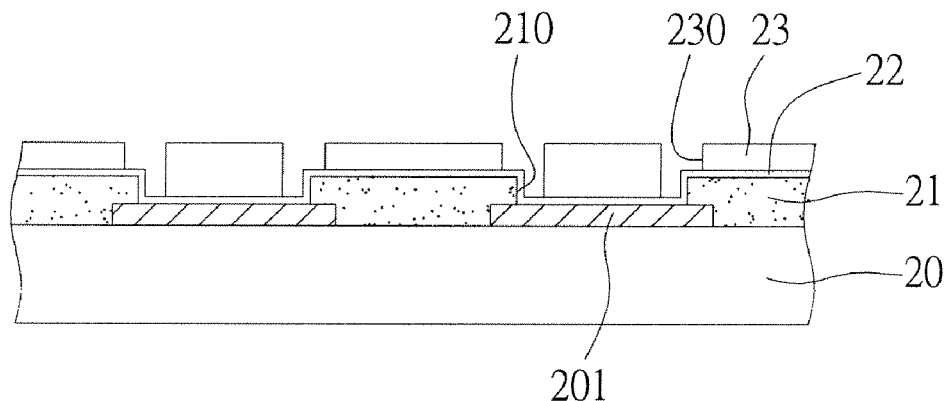
Figure 2D:
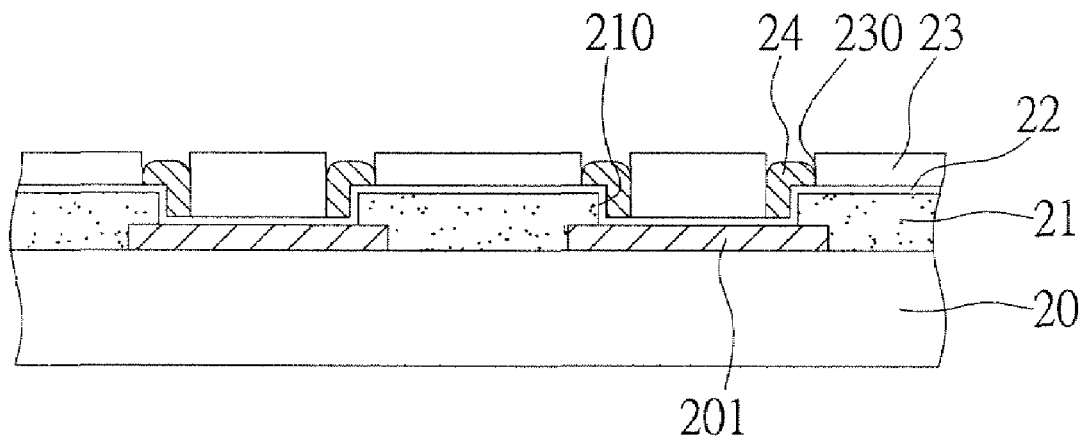
Figure 2E:
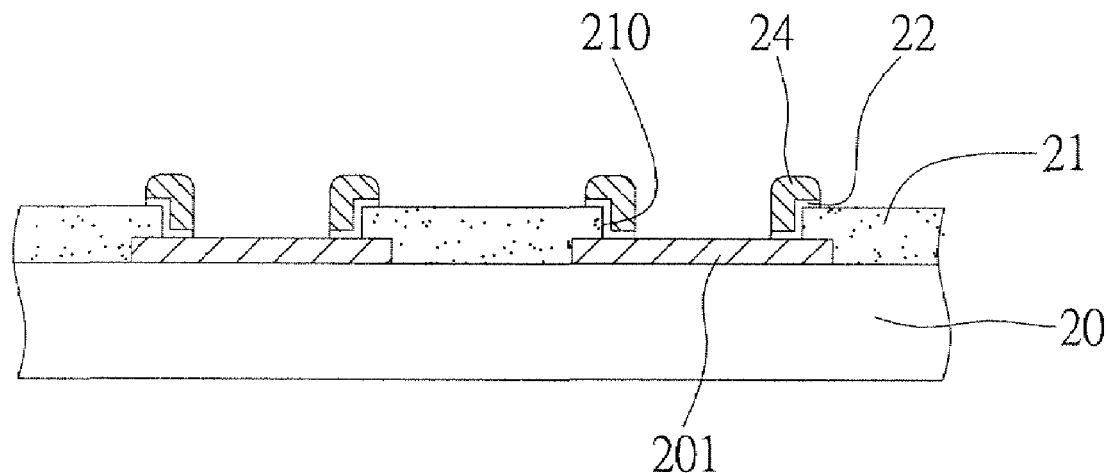
Figure 3A:
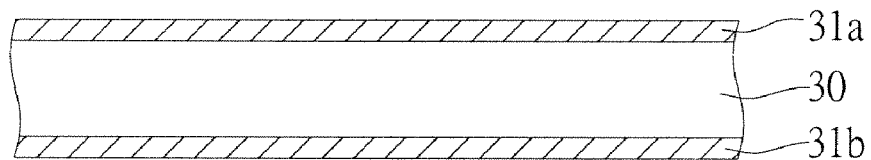
FIGS. 3A to 3H are sectional diagrams showing a manufacturing method of a solder ball disposing surface structure of a package substrate according to a first embodiment of the present invention, wherein FIG. 3F' is another embodiment of FIG. 3F and FIG. 3H' is another embodiment of FIG. 3H.

As shown in FIG. 3A, a core board 30 with a first metal layer 31a and a second metal layer 31b respectively formed on two opposite surfaces thereof is provided. The core board 30 can be a two-layer or multi-layer circuit board with a dielectric layer on surface thereof or an insulating board. Since the manufacturing technique of circuit boards is well known in the art and not characteristic of the present invention, detailed description thereof is omitted.

Figure 3B:
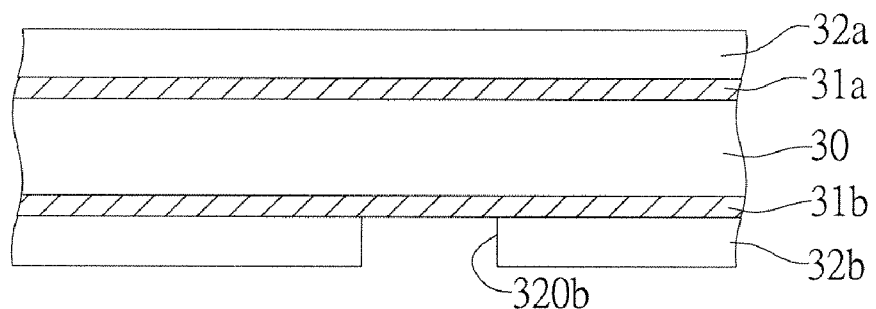

As shown in FIG. 3B, a first resist layer 32a and a second resist layer 32b are formed on the first metal layer 31a and the second metal layer 31b, respectively. The first and second resist layers 32a, 32b can be such as a dry film or liquid photoresist, which is formed on the first and second metal layers 31a, 31b by printing, spin coating or attaching and then patterned by exposure and development so as to form second openings 320b in the second resist layer 32b for exposing a part of the surface of the second metal layer 31b.

Figure 3C:
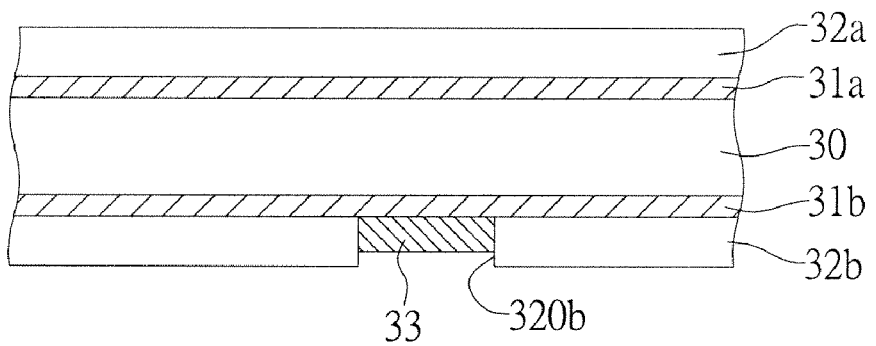

As shown in FIG. 3C, by using the second metal layer 31b as a current conductive path for electroplating, metal bumps 33 are formed on the second metal layer 31b exposed from the second openings 320b of the second resist layer 32b.

Figure 3D:
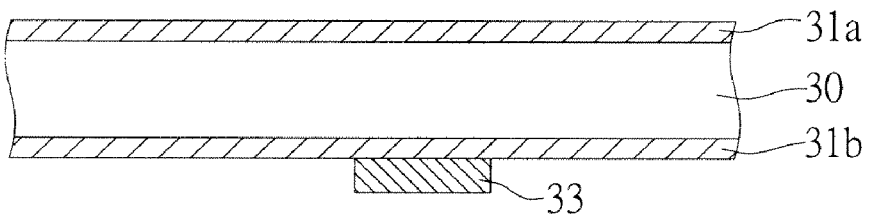

As shown in FIG. 3D, the first and second resist layers 32a, 32b are removed so as to expose the first and second metal layers 31a, 31b and the metal bumps 33.

Figure 3E:
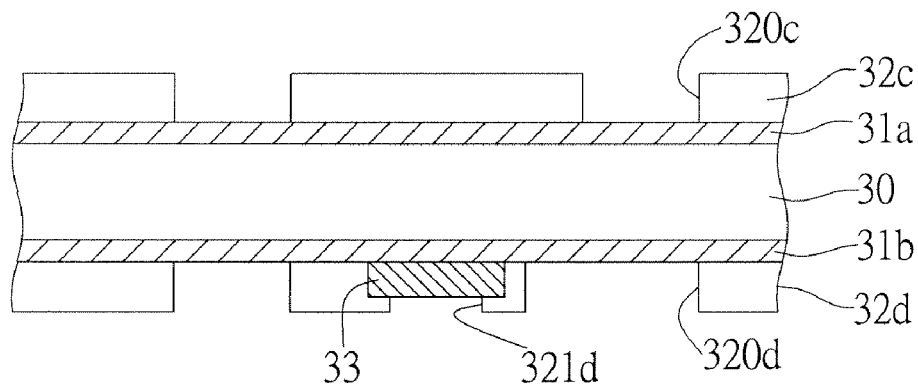

As shown in FIG. 3E, a third resist layer 32c is formed on the first metal layer 31a, and a plurality of third openings 320c is formed in the third resist layer 32c for exposing a part of the surface of the first metal layer 31a; and a fourth resist layer 32d is formed on the second metal layer 31b and the metal bumps 33, and fourth openings 320d are formed in the fourth resist layer 32d for exposing a part of the surface of the second metal layer 31b and fifth openings 321d are formed in the fourth resist layer 32d for exposing a part of the surface of the metal bumps 33.

Figure 3F:
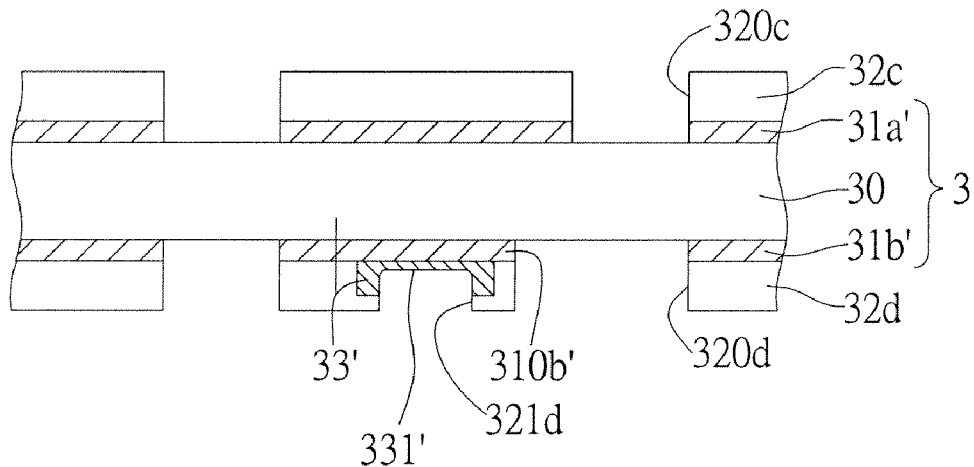
Figure 3F:
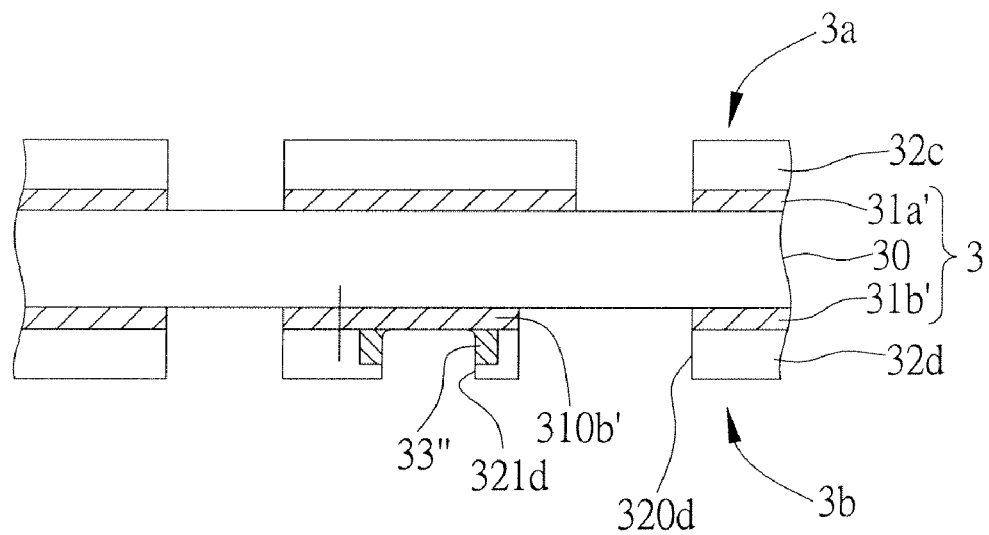

As shown in FIGS. 3F and 3F', the first metal layer 31a in the third openings 320c of the third resist layer 32c, the second metal layer 31b in the fourth openings 320d of the fourth resist layer 32d, as well as the metal bumps 33 in the fifth opening 321d are removed by etching, thereby forming a first circuit layer 31a', a second circuit layer 31b' and metal pads 310b' on the two opposite surfaces of the core board 30, respectively. Therein, each metal bump 33 is partly removed so as to form a metal flange 33' that is disposed around the metal pad 310b' and meanwhile form a metal layer 331' on the metal pad 310b' inside the metal flange 33', as shown in FIG. 3F. Alternatively, each metal bump 33 in the fifth opening 321d can be thoroughly removed, thereby only forming a metal flange 33" that is disposed around the metal pad 310b', as shown in FIG. 3F'. Thus, the core board 30, the first circuit layer 31a' and the second circuit layer 31b' constitute a package substrate 3, which has a chip disposing surface 3a with the first circuit layer 31a' and an opposed solder ball disposing surface 3b with the second circuit layer 31b'.

Figure 3G:
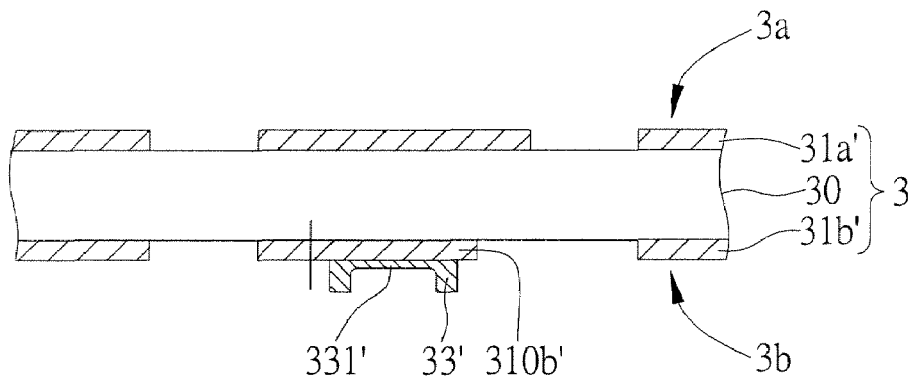

As shown in FIG. 3G, the third and fourth resist layers 32c, 32d are removed so as to expose the first circuit layer 31a', the second circuit layer 31b', the metal pads 310b' and the metal flanges 33' disposed around the metal pads 310b'.

Figure 3H:
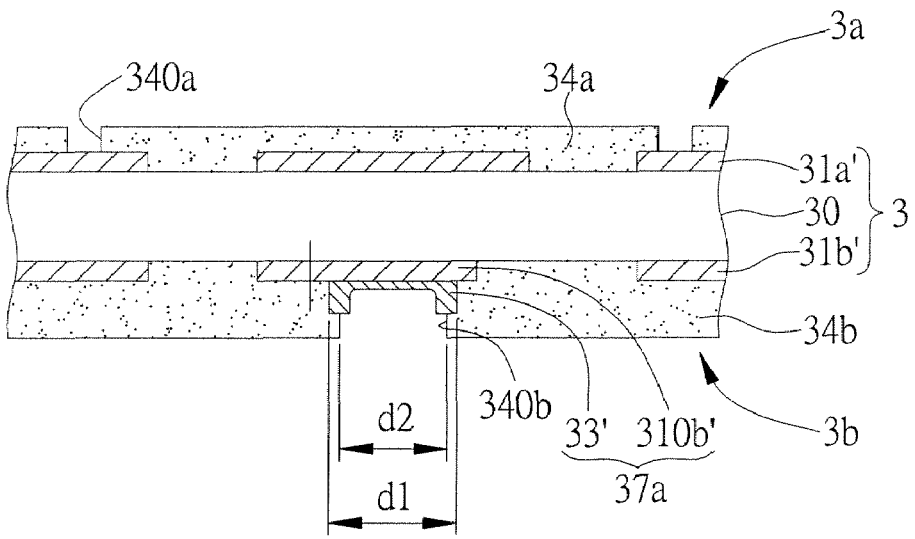
Figure 3H:
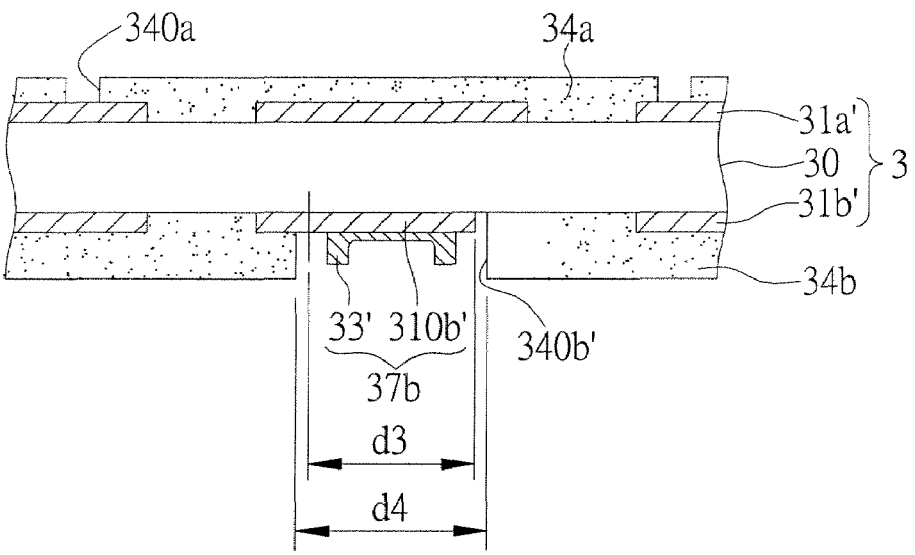

As shown in FIGS. 3H and 3H', a first insulative protection layer 34a is formed on the core board 30 and the first circuit layer 31a', and first openings 340a is formed in the first insulative protection layer 34a so as to expose a part of the surface of the first circuit layer 31a' as electrical connecting pads for electrically connecting a semiconductor chip. A second insulative protection layer 34b is formed on the core board 30, the second circuit layer 31b' and the metal pads 310b', and the second insulative protection layer 34b has second openings 340b formed for exposing a part of the surface of the metal flanges 33', wherein size d2 of the second openings 340b is smaller than outer diameter d1 of the metal flanges 33' such that solder mask defined (SMD) pads 37a can be formed, as shown in FIG. 3H. Alternatively, as shown in FIG. 3H', size d4 of the second openings 340b' is bigger than size d3 of the metal pads 310b' such that the metal pads 310b' and the metal flanges 33' can be exposed to form non solder mask defined (NSMD) pads 37b.

Thus, the present invention provides a solder ball disposing surface structure of a package substrate. As shown in FIG. 3H, the package substrate 3 has a chip disposing surface 3a with a first circuit layer 31a' and a solder ball disposing surface 3b with a second circuit layer 31b', a first insulative protection layer 34a being formed on the chip disposing surface 3a and the first circuit layer 31a'. The solder ball disposing surface structure comprises: metal pads 310b', which are a part of the second circuit layer 31b'; metal flanges 33' disposed around the metal pads 310b'; and a second insulative protection layer 34b formed on the solder ball disposing surface 3b and having second openings 340b.

According to the above structure, size of the second openings 340b can be smaller than outer diameter of the metal flanges 33' so as to expose a part of the surface of the metal flanges 33', thereby forming SMD pads 37a; or size of the second openings 340b' can be bigger than that of the metal pads 310b' so as to expose the metal pads 310b' and the metal flanges 33', thereby forming NSMD pads 37b. The metal flanges 33' can have a shape of circle, ellipse, rectangle or irregular shape. The metal pads 310b' can have a shape of circle, ellipse, rectangle or irregular shape. Outer diameter of the metal flanges 33' is not bigger than that of the metal pads 310b'.

Second Embodiment

FIGS. 4A to 4G are sectional diagrams showing a manufacturing method of a solder ball disposing surface structure of a package substrate according to a second embodiment of the present invention.

Figure 4A:
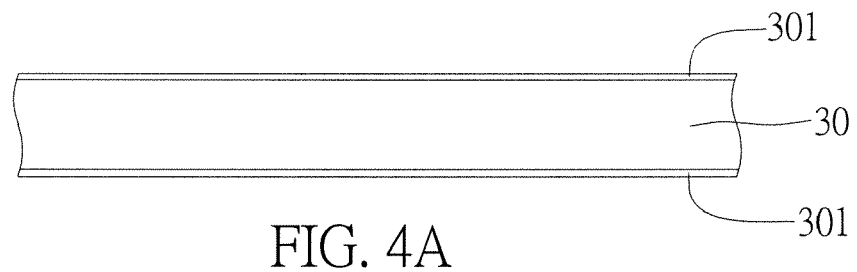
FIGS. 4A to 4G are sectional diagrams showing a manufacturing method of a solder ball disposing surface structure of a package substrate according to a second embodiment of the present invention.

As shown in FIG. 4A, a core board 30 with a conductive layer 301 formed on two opposite surfaces thereof is provided. The core board 30 can be an insulating board, a copper clad laminate board or a two-layer or multi-layer circuit board having dielectric layer on surface thereof. Since the manufacturing technique of circuit boards is well known in the art and not characteristic of the present invention, detailed description thereof is omitted.

Figure 4B:
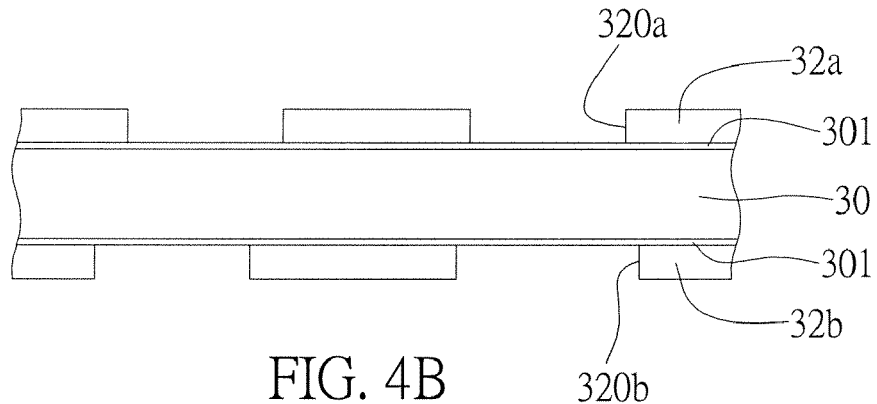

As shown in FIG. 4B, a first resist layer 32a and a second resist layer 32b are formed on the conductive layer 301 of the two opposite surfaces of the core board 30, respectively. The first and second resist layers 32a, 32b respectively have first openings 320a and second openings 320b for exposing a part of the surface of the conductive layer 301.

Figure 4C:
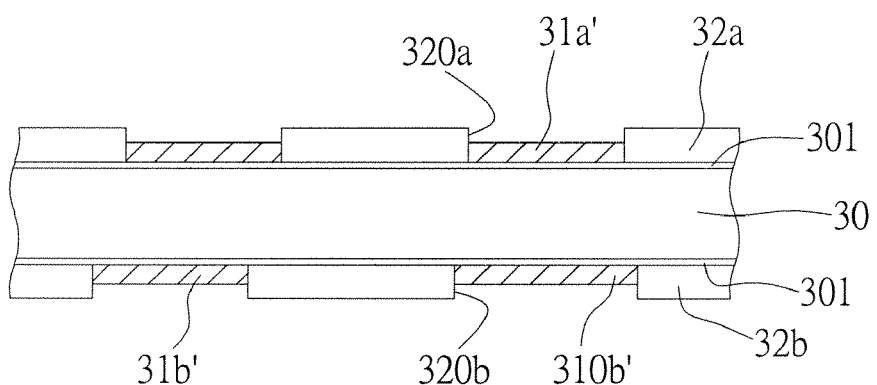

As shown in FIG. 4C, by using the conductive layer 301 as a current conductive path for electroplating, a first circuit layer 31a' is formed in the first openings 320a of the first resist layer 32a and a second circuit layer 31b' is formed in the second openings 320b of the second resist layer 32b, wherein the second circuit layer 31b' has metal pads 310b'.

Figure 4D:
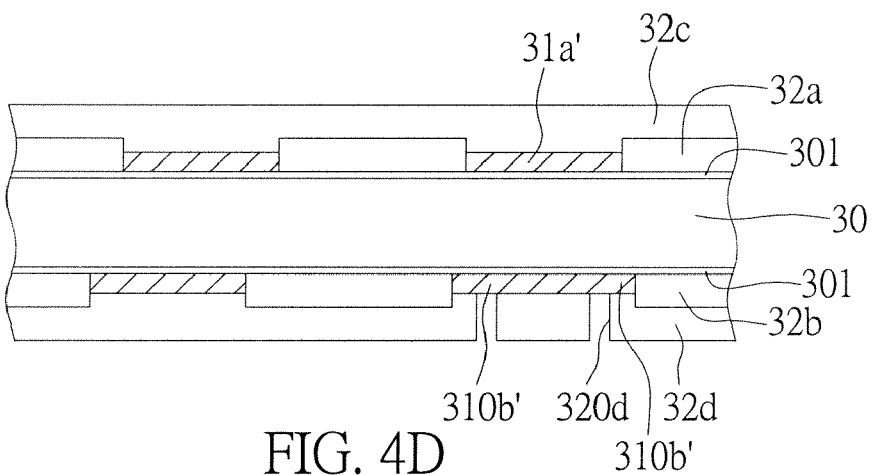

As shown in FIG. 4D, a third resist layers 32c is formed on surfaces of the first resist layer 32a and the first circuit layer 31a', and a fourth resist layer 32d is formed on surfaces of the second resist layer 32b and the second circuit layer 31b', wherein the fourth resist layer 32d has ring-shaped openings 320d for exposing a part of the surface of the metal pads 310b'.

Figure 4E:
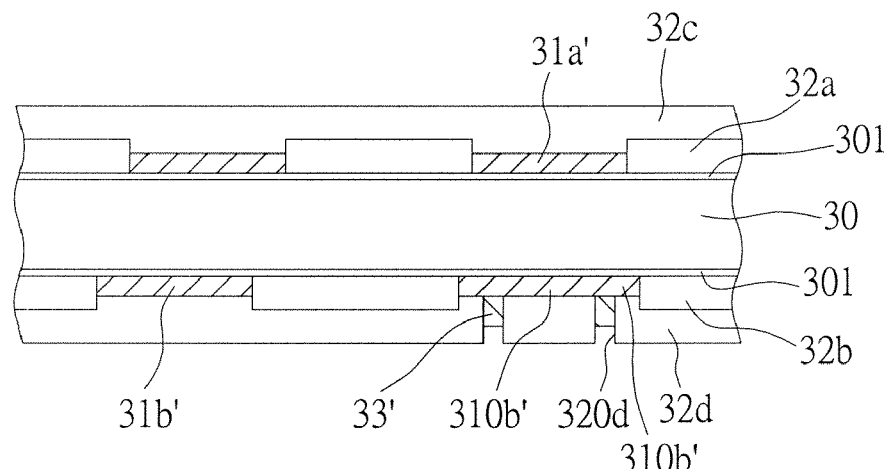

As shown in FIG. 4E, by using the conductive layer 301 as a current conductive path for electroplating, metal flanges 33' are formed on the surface of the metal pads 310b'.

Figure 4F:
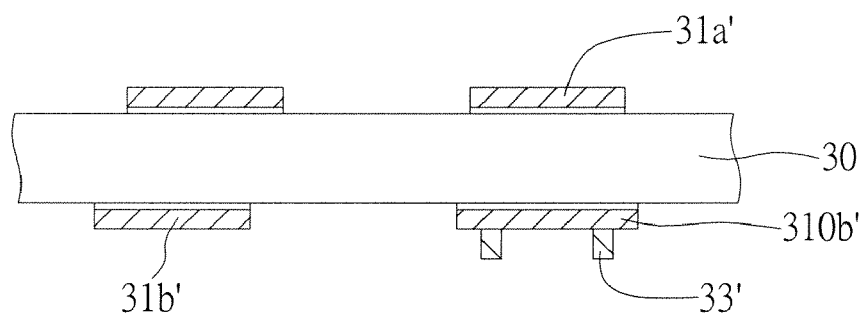

As shown in FIG. 4F, the third resist layer 32c, the first resist layer 32a and the conductive layer 301 covered by the first resist layer 32a, the fourth resist layer 32d, the second resist layer 32b and the conductive layer 301 covered by the second resist layer 32b are removed so as to expose the first circuit layer 31a', the second circuit layer 31b' and the metal flanges 33' on the metal pads 310b'.

Figure 4G:
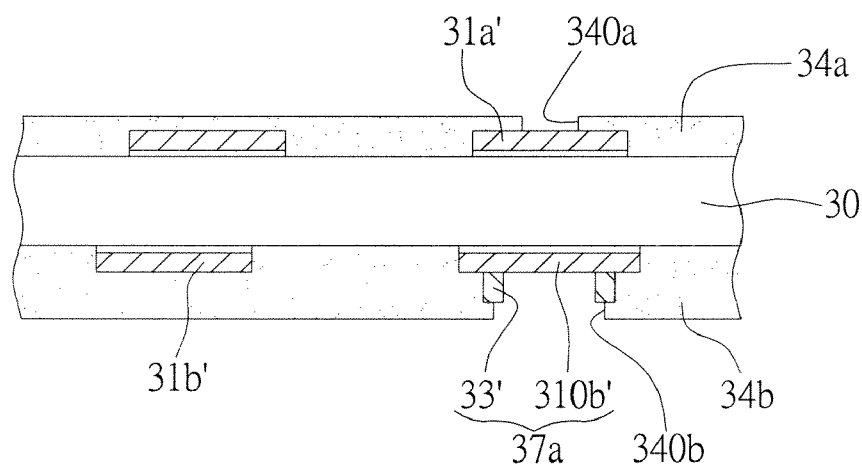
Figure 4G:
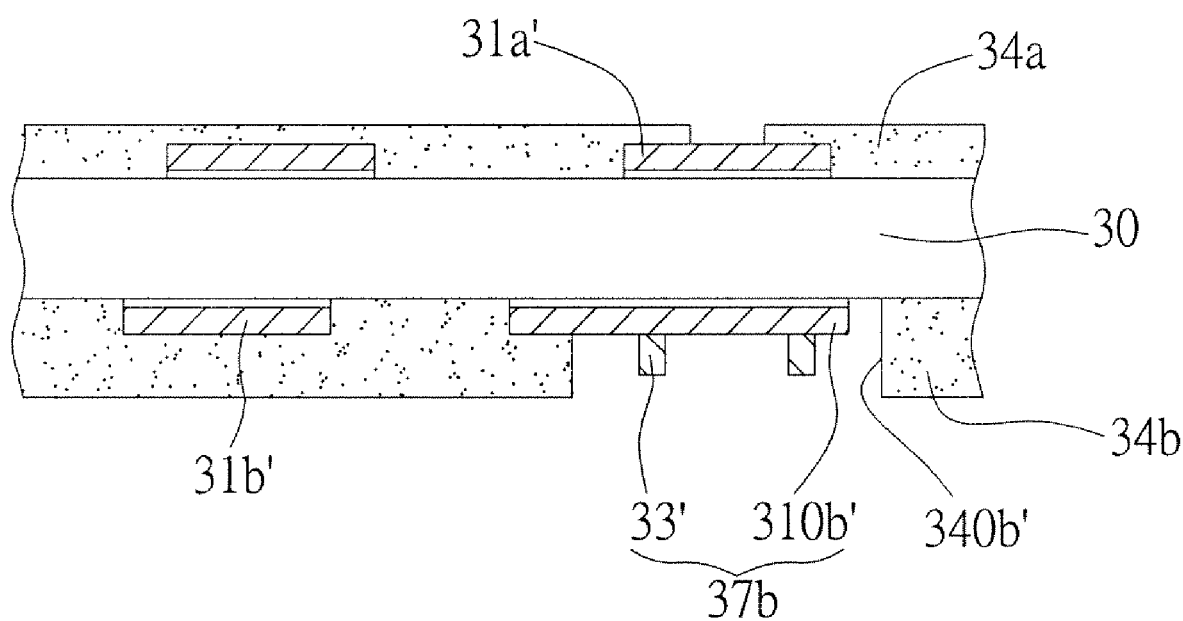

As shown in FIGS. 4G and 4G', a first insulative protection layer 34a is formed on the core board 30 and the first circuit layer 31a', and the first insulative protection layer 34a has first openings 340a formed so as to expose a part of the surface of the first circuit layer 31a' as electrical connecting pads for electrically connecting a semiconductor chip. A second insulative protection layer 34b is formed on the core board 30, the second circuit layer 31b' and the metal pads 310b', and the second insulative protection layer 34b has second openings 340b formed for exposing a part of the surface of the metal flanges 33', wherein size of the second openings 340b is smaller than outer diameter of the metal flanges 33' such that solder mask defined (SMD) pads 37a can be formed, as shown in FIG. 4G. Alternatively, as shown in FIG. 4G', size of the second openings 340b' is bigger than that of the metal pads 310b' such that the metal pads 310b' and the metal flanges 33' can be exposed to form non solder mask defined (NSMD) pads 37b. The metal flanges 33' can have a shape of circle, ellipse, rectangle or irregular shape. The metal pads 310b' can have a shape of circle, ellipse, rectangle or irregular shape. Outer diameter of the metal flanges 33' is not bigger than that of the metal pads 310b'.

Figure 5A:
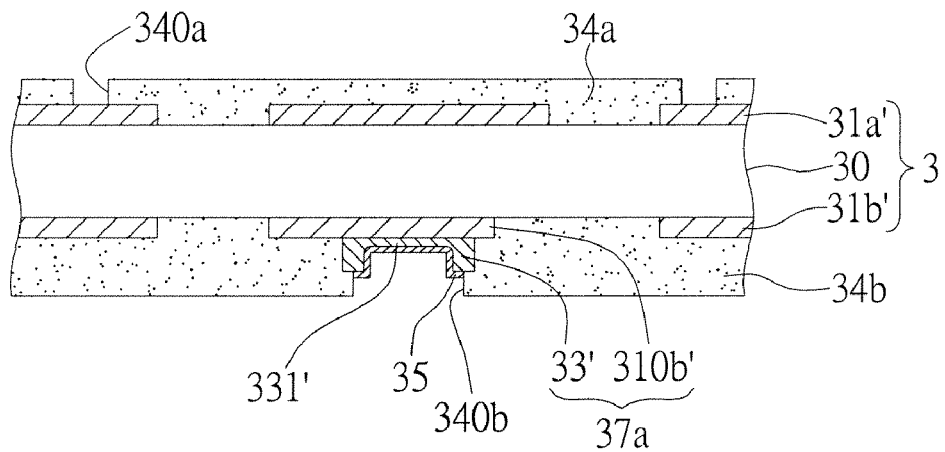
FIG. 5A is a diagram showing a solder ball disposing surface structure with a surface treatment layer disposed on the metal pads and the metal flanges of SMD pads.
Figure 5B:
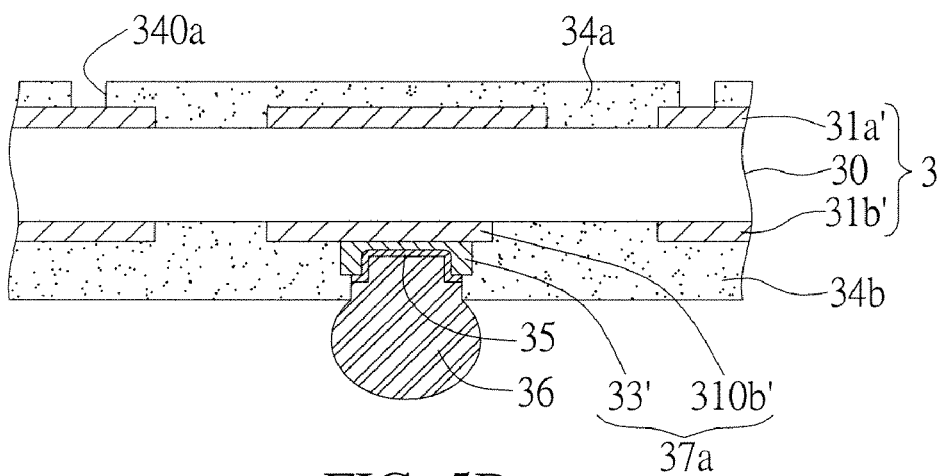
FIG. 5B is a diagram showing a solder ball disposing surface structure with conductive elements disposed on the surface treatment layer of FIG. 5A.
Figure 5C:
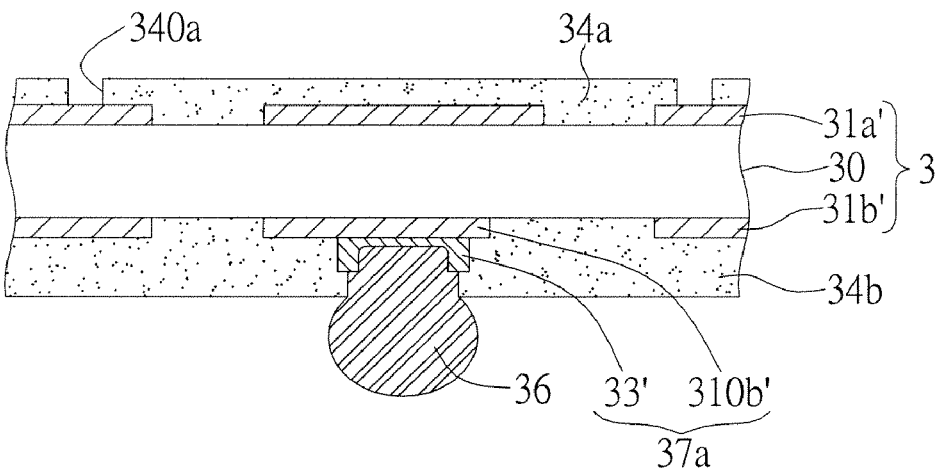
FIG. 5C is a diagram showing a solder ball disposing surface structure with conductive elements disposed on the metal pads and the metal flanges of SMD pads.

Referring to FIGS. 5A to 5C, a surface treatment layer 35 is further formed on the SMD pads 37a. The surface treatment layer 35 may be one of an OSP layer, a Ni/Au layer, a Ni/Pd/Au layer and a Sn/Pb layer. Alternatively, the surface treatment layer 35 may be made of one of the group of consisting of Au, Ag, Sn and Cu. As shown in FIG. 5B, conductive elements 36 of solder balls are further formed on the surface treatment layer 35. Alternatively, as shown in FIG. 5C, conductive elements 36 of solder balls are formed on the SMD pads 37a.

Figure 6A:
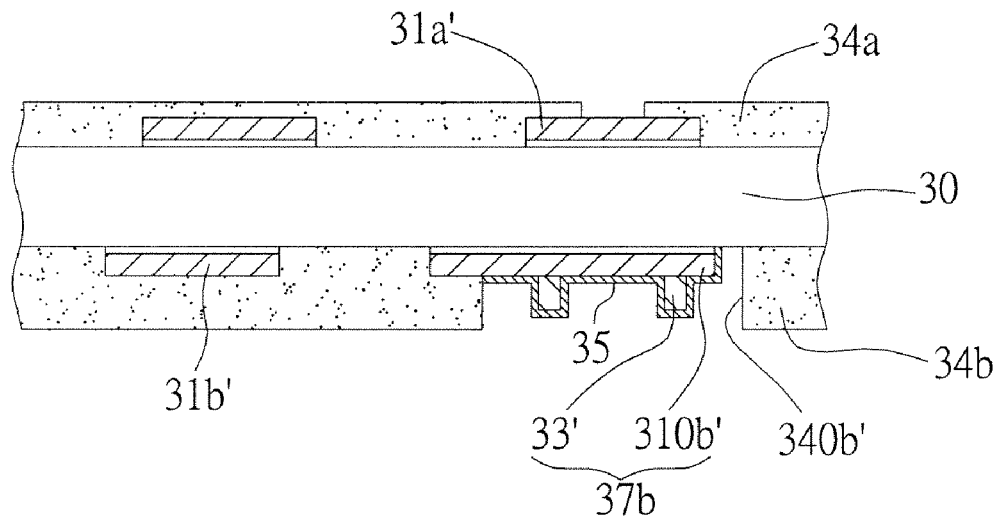
FIG. 6A is a diagram showing a solder ball disposing surface structure with a surface treatment layer disposed on the metal pads and the metal flanges of NSMD pads.
Figure 6B:
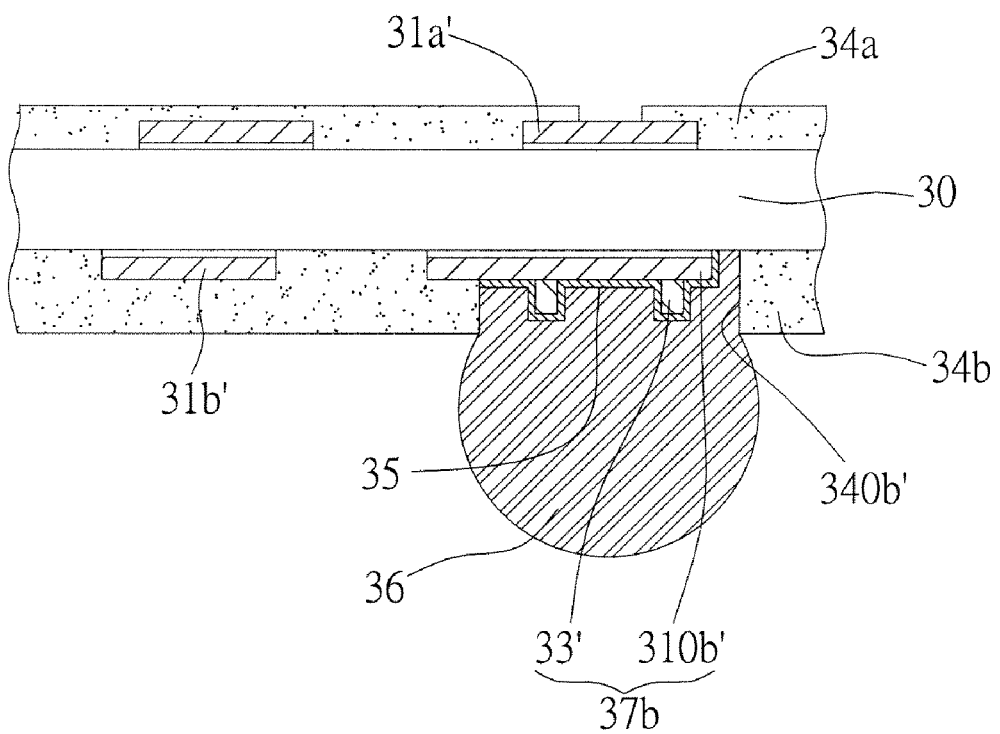
FIG. 6B is a diagram showing a solder ball disposing surface structure with conductive elements disposed on the surface treatment layer of FIG. 6A.
Figure 6C:
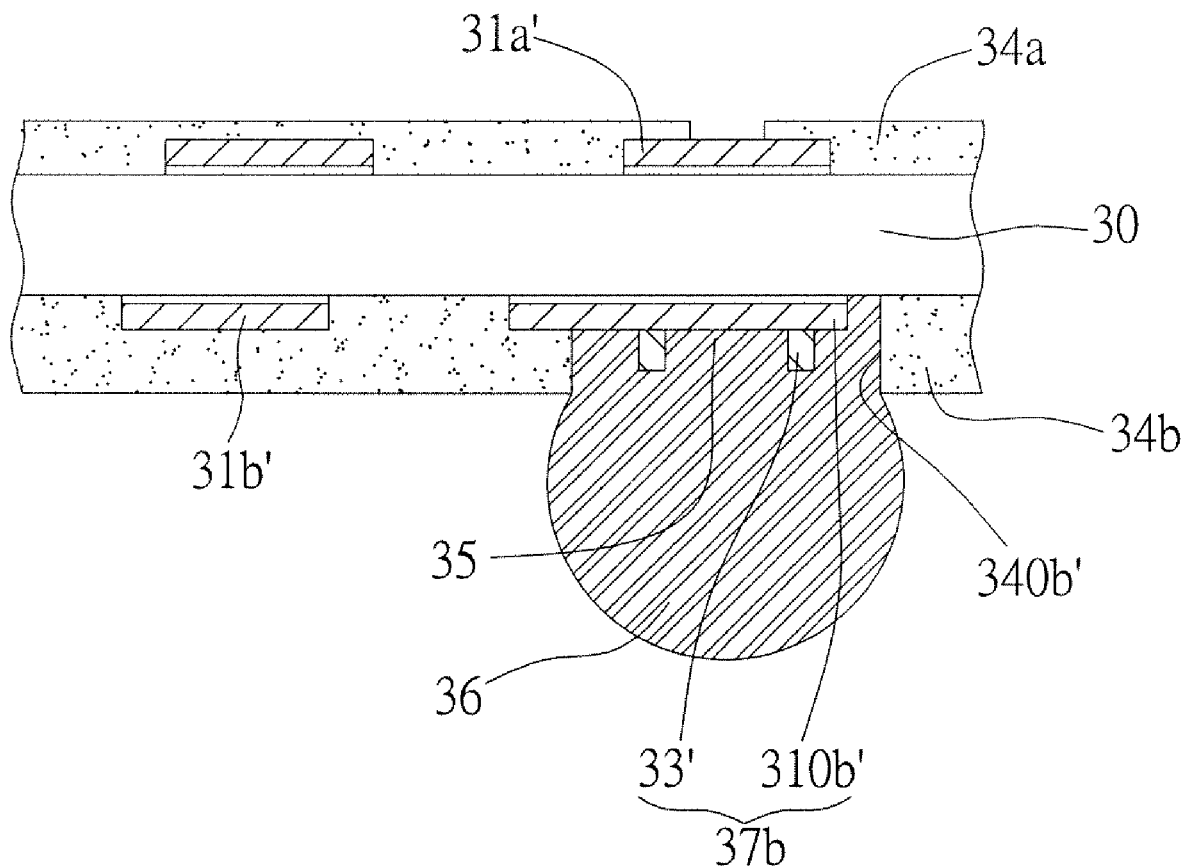
FIG. 6C is a diagram showing a solder ball disposing surface structure with conductive elements disposed on the metal pads and the metal flanges of NSMD pads.

Referring to FIGS. 6A to 6C, a surface treatment layer 35 is formed on the NSMD pads 37b. The surface treatment layer 35 may be one of an OSP layer, a Ni/Au layer, a Ni/Pd/Au layer and a Sn/Pb layer. Alternatively, the surface treatment layer 35 may be made of one of the group of consisting of Au, Ag, Sn and Cu. As shown in FIG. 6B, conductive elements 36 of solder balls are further formed on the surface treatment layer 35. Alternatively, as shown in FIG. 6C, conductive elements 36 of solder balls are formed on the NSMD pads 37b.

According to the present invention, metal flanges are formed on the metal pads of the solder ball disposing surface of a package substrate, thereby increasing the contact area of the metal pads. In addition, the bonding area for conductive elements on electrical connecting pads can further be increased by adjusting type of openings in the insulative protection layer. Moreover, since no conductive layer is formed between the metal pads and the metal flanges as in the prior art, the bonding strength between the metal pads and the metal flanges is improved, thereby preventing detaching of the conductive elements subsequently formed on the metal pads and the metal flanges.

The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A manufacturing method of a solder ball disposing surface structure of a package substrate comprising:

providing a core board with a first metal layer and a second metal layer respectively formed on two opposite surfaces thereof;

forming metal bumps on the second metal layer by electroplating;

forming a third resist layer on the first metal layer and forming third openings in the third resist layer for exposing a part of the surface of a first metal layer, and forming a fourth resist layer on the second metal layer and the metal bumps and forming fourth openings in the fourth resist layer for exposing a part of a surface of the second metal layer and forming fifth openings in the fourth resist layer for exposing a part of surfaces of the metal bumps;

removing the first and second metal layers in the third and fourth openings of the third and fourth resist layers so as to respectively form a first circuit layer, a second circuit layer and metal pads on the surfaces of the first and second metal layers of the core board, and removing the metal bumps in the fifth openings so as to form metal flanges disposed around the metal pads;

removing the third and fourth resist layers;

forming a first insulative protection layer on the core board and the first circuit layer and forming first openings in the first insulative protection layer for exposing a part of a surface of the first circuit layer as electrical connecting pads; and forming a second insulative protection layer on the core board, the second circuit layer and the metal pads, and forming second openings in the second insulative protection layer so as to expose a part of surfaces of the metal flanges.

2. The manufacturing method of claim 1, wherein size of the second openings is not bigger than outer diameter of the metal flanges.

3. The manufacturing method of claim 1, wherein size of the second openings is bigger than outer diameter of the metal pads.

4. The manufacturing method of claim 1, wherein the core board is one of a two-layer or multi-layer circuit board with a dielectric layer on surface thereof and an insulating board.

5. The manufacturing method of claim 1, wherein outer diameter of the metal flanges is not bigger than that of the metal pads.

6. The manufacturing method of claim 1, wherein the manufacturing method of forming the metal bumps on the second metal layer by electroplating comprises:

forming a first resist layer and a second resist layer on the first metal layer and the second metal layer respectively, the second resist layer having openings for exposing a part of the surface of the second metal layer;

forming metal bumps on the second metal layer in the second openings of the second resist layer by electroplating; and removing the first and second resist layers so as to expose the first metal layer, the second metal layer and the metal bumps.

7. The manufacturing method of claim 1, wherein the metal bumps in the fifth openings are partly removed so as to form a metal layer on the metal pads.

8. The manufacturing method of claim 7, further comprising forming a surface treatment layer on the metal flanges and the metal layer.

9. The manufacturing method of claim 8, further comprising forming conductive elements of solder balls on the surface treatment layer.

10. The manufacturing method of claim 7, further comprising forming conductive elements of solder balls on the metal flanges and the metal layer.

11. The manufacturing method of claim 1, wherein the metal bumps in the fifth openings are thoroughly removed so as to expose a part of the surface of the metal pads.

12. The manufacturing method of claim 11, further comprising forming a surface treatment layer on the metal flanges and the metal pads.

13. A manufacturing method of a solder ball disposing surface structure of a package substrate comprising:

providing a core board;

forming a conductive layer on two opposite surfaces of the core board;

respectively forming a first resist layer and a second resist layer on the conductive layer on the two opposite surfaces of the core board, the first and second resist layers respectively having first openings and second openings for exposing a part of a surface of the conductive layer;

respectively forming a first circuit layer and a second circuit layer in the first and second openings of the first and second resist layers by electroplating, wherein the second circuit layer has metal pads;

forming a third resist layer on the first resist layer and the first circuit layer, and forming a fourth resist layer on the second resist layer and the second circuit layer, the fourth resist layer having ring-shaped openings for exposing a part of surfaces of the metal pads;

forming metal flanges on the metal pads by using the conductive layer as a current conductive path for electroplating;

removing the third resist layer, the first resist layer and the conductive layer covered by the first resist layer, the fourth resist layer, the second resist layer, and the conductive layer covered by the second resist layer, thereby exposing the first circuit layer, the second circuit layer and the metal flanges on the metal pads;

forming a first insulative protection layer on the core board and the first circuit layer and forming first openings in the first insulative protection layer for exposing a part of a surface of the first circuit layer as electrical connecting pads; and forming a second insulative protection layer on the core board, the second circuit layer and the metal pads, and forming second openings in the second insulative protection layer so as to expose a part of surfaces of the metal flanges.

14. The manufacturing method of claim 13, wherein a size of each of the second openings is not greater than an outer diameter of each of the metal flanges.

15. The manufacturing method of claim 13, wherein a size of each of the second openings is greater than an outer diameter of each of the metal pads.

16. The manufacturing method of claim 13, wherein the core board is one of a two-layer or multi-layer circuit board with a dielectric layer on surface thereof, a copper clad laminate board and an insulating board.

17. The manufacturing method of claim 13, wherein an outer diameter of each of the metal flanges is not greater than that of each of the metal pads.

18. The manufacturing method of claim 13, further comprising forming a surface treatment layer on the metal flanges and the metal pads.

19. The manufacturing method of claim 18, further comprising forming conductive elements of solder balls on the surface treatment layer.

20. The manufacturing method of claim 13, further comprising forming conductive elements of solder balls on the metal flanges and the metal pads.

* * * * *